United States Patent
Jeter et al.

(10) Patent No.: US 9,691,470 B1
(45) Date of Patent: Jun. 27, 2017

(54) APPARATUS AND METHOD FOR RESTRICTED RANGE MEMORY CALIBRATION

(71) Applicant: Apple Inc., Cupertino, CA (US)

(72) Inventors: Robert E. Jeter, Santa Clara, CA (US); Rakesh L. Notani, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/188,928

(22) Filed: Jun. 21, 2016

(51) Int. Cl.
  *G11C 7/06* (2006.01)
  *G11C 11/4076* (2006.01)
  *G11C 11/4074* (2006.01)
  *G11C 11/4096* (2006.01)

(52) U.S. Cl.
  CPC ...... *G11C 11/4076* (2013.01); *G11C 11/4074* (2013.01); *G11C 11/4096* (2013.01)

(58) Field of Classification Search
  CPC .......... G11C 2207/2254; G11C 29/028; G11C 7/1066; G11C 16/26; G11C 16/32; G11C 29/022; G11C 7/1051; G11C 7/22; G11C 29/023; G11C 5/04; G11C 7/1072; G11C 7/1093; G11C 7/222
  USPC ............ 365/193, 129, 149, 189.011, 189.05, 365/189.14, 189.15, 191, 194, 198, 365/230.06, 233.1, 233.13, 233.16, 365/233.17
  See application file for complete search history.

(56) References Cited

U.S. PATENT DOCUMENTS

| | | |
|---|---|---|
| 2010/0315119 A1* | 12/2010 | Welker ................. H03K 5/1565 327/175 |
| 2012/0159230 A1 | 6/2012 | Chen |
| 2013/0262791 A1 | 10/2013 | Henderson et al. |
| 2015/0033062 A1 | 1/2015 | Tsao et al. |
| 2015/0089164 A1 | 3/2015 | Ware et al. |
| 2015/0310903 A1 | 10/2015 | Bansal et al. |

* cited by examiner

*Primary Examiner* — Thong Q Le
(74) *Attorney, Agent, or Firm* — Meyertons, Hood, Kivlin, Kowert & Goetzel, P.C.; Erik A. Heter

(57) ABSTRACT

An apparatus and method for a restricted range calibration is disclosed. A system includes a memory coupled to a memory controller. The memory controller is coupled to receive a clock signal, and is configured to operate in different performance states corresponding to different frequencies of the clock signal. The memory controller provides a data strobe signal to synchronize transfers of data to and from the memory. When operating in a first performance state, the memory controller may perform a first calibration of a delay applied to the data strobe signal. Performing the first calibration includes varying the delay over a first range of values. Thereafter, responsive to returning to the first performance state from another performance state, the memory controller may perform a second calibration. The second calibration includes varying the delay over a second range of values that is less than the first range.

19 Claims, 6 Drawing Sheets

APPARATUS AND METHOD FOR RESTRICTED RANGE MEMORY CALIBRATION

BACKGROUND

Technical Field

This disclosure is directed to memory subsystems, and more particularly, calibration of signals conveyed in memory subsystems.

Description of the Related Art

Eye patterns, or eye diagrams, are graphic illustrations that illustrate times and amplitudes at which a digital signal can be sampled at its correct value. In various types of systems that include data transmissions, sampling of signals (based on a clock signal) near a center of an eye, in terms of time, may be desirable. This may provide a signal with a sufficient amount of both setup and hold time, while also rendering it less susceptible to noise. In sampling a signal, a threshold voltage is used to determine whether the signal is interpreted as a logic 0 or a logic 1.

In memory systems, calibrations may be performed to determine the points at which signals are sampled within the eye pattern. Calibrations may be performed to determine both the point in time at which signals are sampled, as well as to determine the threshold voltage for distinguishing between logic 0's and logic 1's. Performing these calibrations typically includes adjusting a number of different parameters that govern transmission of data between a memory controller and a memory. Such calibrations may be performed on a periodic basis. Additionally, since some systems have multiple operating points (e.g., combinations of clock frequency and supply voltage), calibrations may also be performed upon a switch from one operating point to another.

An apparatus and method for a restricted range calibration is disclosed. In one embodiment, a system includes a memory coupled to a memory controller. The memory controller is coupled to receive a clock signal, and is configured to operate in different performance states corresponding to different frequencies of the clock signal. The memory controller is also coupled to provide a data strobe signal to synchronize transfers of data to the memory. When operating in a first performance state, the memory controller may perform a first calibration of a delay applied to the data strobe signal. Performing the first calibration includes varying the delay over a first range of values. Thereafter, responsive to returning to the first performance state from another performance state, the memory controller may perform a second calibration. The second calibration includes varying the delay over a second range of values that is less than the first range.

In one embodiment, endpoints for the second (restricted) range may be calculated based on a variance that may be at least in part predetermined. The variance may include a manufacturer's specification for the worst case variance under certain voltage and temperature conditions. In some embodiments, the variance may also include some amount of phase shift (e.g., −90° at one endpoint, +90° at the other endpoint). Using the determined variance, the range can be determined around previously calibrated delay value for the temperature/voltage conditions. The calibration over the restricted range can then be conducted by performing writes to memory and reads therefrom at different values of delay applied to the data strobe. The delay value may be incremented, e.g., from one endpoint to the other, with writes and corresponding reads being conducted at every increment. The resulting delay value chosen from this calibration may be one of the values at which the data read from the memory matches that written thereto (which may be referred to as a passing range). In one embodiment, delay value near the center of the passing range (and thus near the center of an eye opening) may be chosen as the calibrated delay value.

BRIEF DESCRIPTION OF THE DRAWINGS

The following detailed description makes reference to the accompanying drawings, which are now briefly described.

Figure 1:
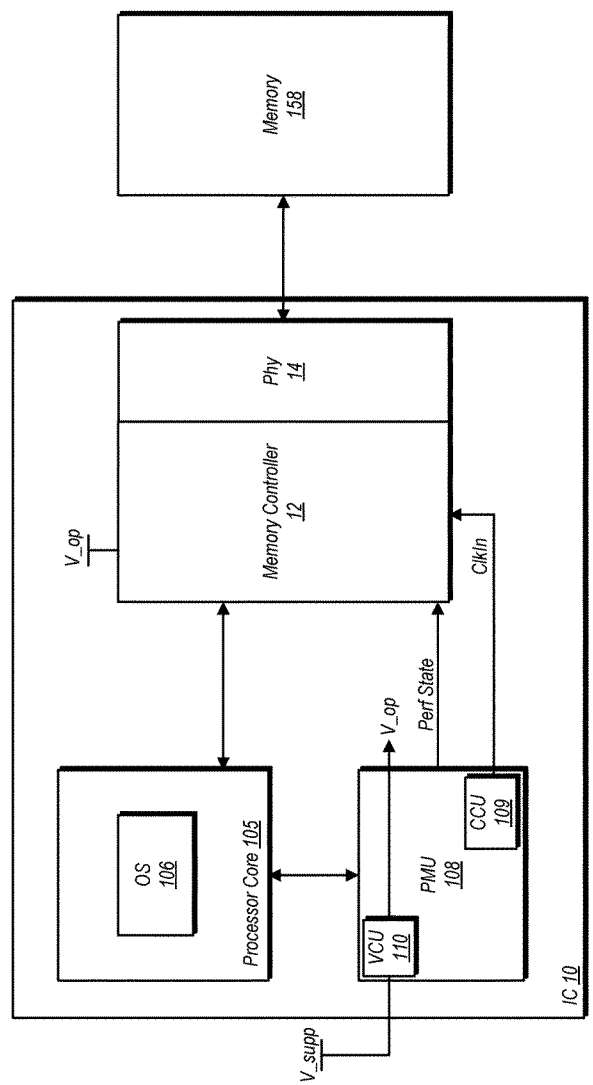
FIG. 1 is a block diagram of one embodiment of an integrated circuit and a memory coupled thereto.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. An "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. §112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

FIG. 1 is a block diagram of one embodiment of an integrated circuit (IC). IC 10 is shown here as a simplified block diagram including various units/circuits implemented thereon. However, other embodiments are possible and contemplated, and may include additional circuits/units not shown here or explicitly discussed herein.

In the embodiment shown, IC 10 is coupled to a memory 158. In one embodiment, memory 158 is a dynamic random access memory (DRAM), although the scope of this disclosure is not limited to DRAM.

IC 10 in the embodiment shown includes at least one processor core 105, although multiple instances of the same may be present. Processor core 105 is configured to execute software instructions, including those of operating system (OS) 105. The instructions of OS 105 may, when executed, cause various system management functions to be performed, such as memory allocation, performance state changes, and so forth.

IC 10 also includes a power management unit (PMU) 108 in the illustrated embodiment. PMU 108 may implement circuitry that performs various power control functions, such as operating voltage changes, power gating, clock frequency changes, and clock gating. These power control functions may be performed in conjunction with performance state changes. Such performance state changes may be put into effect via execution of instructions of OS 105 or through other mechanisms within PMU 108 itself. A performance state (which may also be referred to herein as an operating point) may be defined as combination of an operating voltage and clock frequency. These parameters may be adjusted for desired performance and power savings. For example, if high performance is desired at a given time during operation, the clock frequency and/or the operating voltage may be increased. If reducing power consumption is prioritized at a given time during operation, the clock frequency and/or supply voltage may be reduced. In general, PMU 108 may adjust the clock frequency and/or operating voltage during operation in an attempt to optimize the amount of performance achieved per watt of power consumed.

PMU 108 in the illustrated embodiment includes a clock control unit (CCU) 109. A clock signal, ClkIn, may be provide from CCU 109 to a memory controller 12 of IC 10. This clock signal may be generated internal to CCU 109, or by other clock generation circuitry external thereto.

PMU 108 in the embodiment shown also includes a voltage control unit (VCU) 110. An external supply voltage, V_supp, is provided to VCU 110. Circuitry within VCU 110 may adjust the voltage output therefrom, V_op, which is the operating voltage supplied to memory controller 12, among other places. PMU 108 may accomplish performance state changes by adjusting the frequency of the clock output from CCU 109, changing the operating voltage, or both.

Memory controller 12, which includes physical interface (PHY) 14, provides an interface between processor core 105 and memory 158. Although not explicitly shown, IC 10 may also include one or more units of interface circuitry that are also coupled to memory controller 12. Accordingly, memory controller 12 may provide an interface for one or more circuits external to IC 10 and memory 158.

During operation, memory controller 12 may operate in a number of different performance states. The different performance states may in turn utilize different frequencies for ClkIn with respect to one another, and different operating voltages as well. In some embodiments, the decision to change the performance state may be made by OS 106. In other embodiments, the decision may be made by PMU 108. In either case, PMU 108 may provide an indication ('Perf State') that a performance state change is pending. Memory controller 12 may use the information of the pending clock frequency change to perform certain actions. Among these action, as is discussed below, is to set certain parameters to pre-calibrated values upon entry into the new state.

Figure 2:
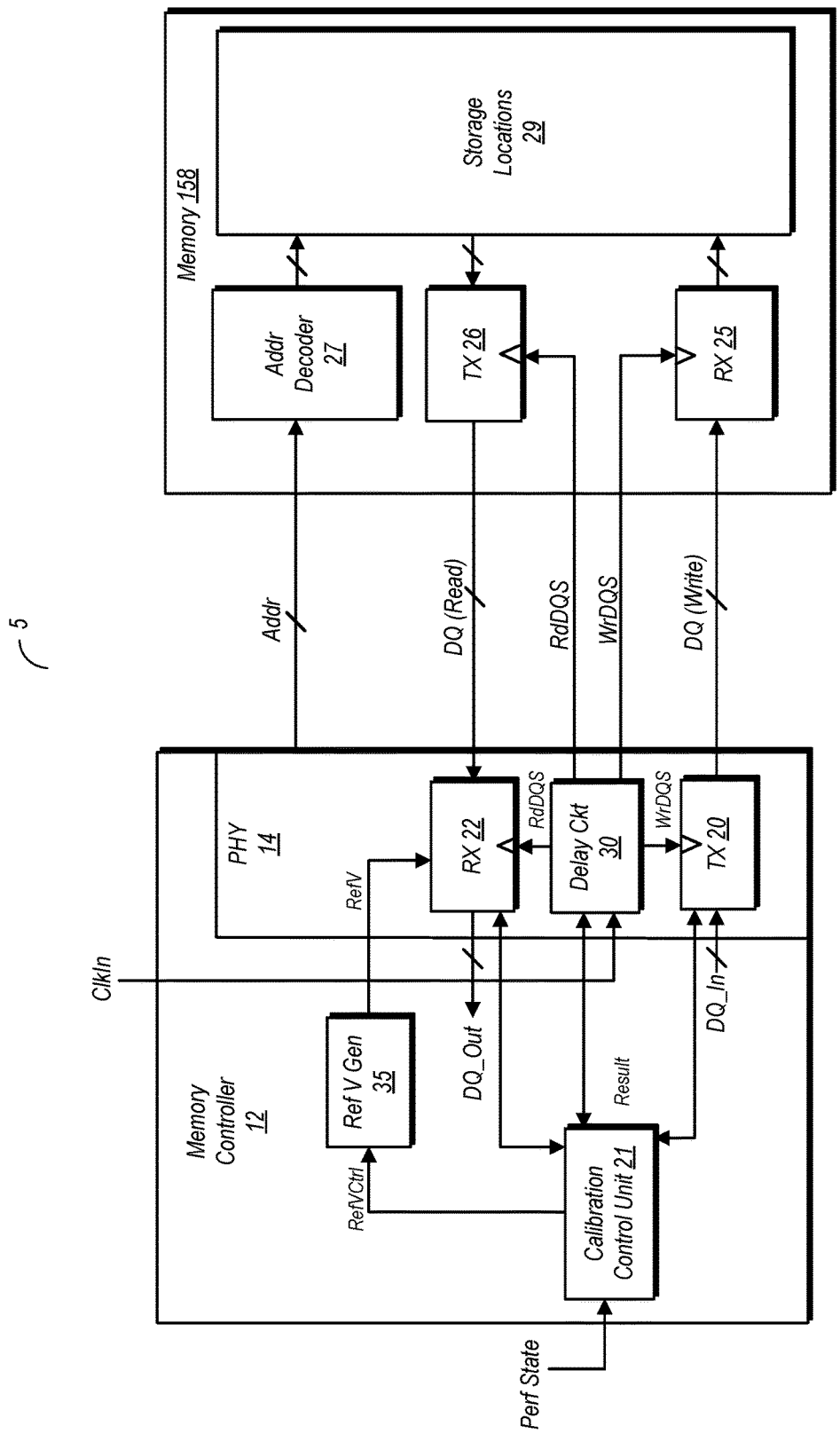
FIG. 2 is a block diagram of one embodiment of a memory subsystem.

Turning now to FIG. 2, a block diagram of a system having a memory controller and a memory is shown. In the embodiment shown, system 5 includes a memory controller 12 and a memory 158. The memory controller 12 includes a physical layer 14 which is used for interfacing with memory 158. The physical layer 14 includes a receiver 22 configured to receive data read from memory 158, and a transmitter 20 configured to transmit data to memory 158. Memory 158 includes an address decoder 27, a number of storage locations 29, a receiver 25 configured to receive data to be written and a transmitter 26 configured to transmit data that has been read. Although not explicitly shown, memory 158 may include additional logic for receiving read and write enable signals, with such logic being configured to enable selected storage locations for read and write operations, respectively. Additionally, memory controller 12 in the embodiment shown includes calibration control unit 21, which may perform various functions, including conducting various embodiments of a calibration method discussed below.

Physical layer 14 includes a delay circuit 30 that is coupled to receive an input clock signal ('Clk'), which may be used as a basis for generating data strobe signals. In the embodiment shown, delay circuit 30 may include two separate paths to apply delays to the input clock signal to generate a read data strobe ('RdDQS') and a write data strobe ('WrDQS'). For example, one embodiment of delay circuit 30 may include a pair of delay locked loops (DLLs), one configured to output the read data strobe and one to output the write data strobe. The delays of the respective DLL's may be set according to control signals generated elsewhere in memory controller 12, e.g., in calibration control unit 21. Types of delay circuits other than DLL's are also possible and contemplated for various other embodiments.

Delay circuit 30 may provide the read data strobe to receiver 22 in physical layer 14, as well as to transmitter 26 in memory 158. The read data strobe signal may be used in synchronizing reads of memory 158. The write data strobe may be provided to transmitter 20 of physical layer 14, along with receiver 25 of memory 158. Accordingly, the write data strobe may be used in synchronizing writes to memory 158.

Memory 158 in the embodiment shown includes an address decoder 27 coupled to receive an address from physical layer 14 of memory controller 12. Address decoder 27 may decode the received address to enable particular ones of the storage locations 29 that are to be enabled for a current memory operation. Addresses may be provided from physical layer 14 of memory controller 12 for both read operation and write operations.

The data strobe signals provided by delay circuit 30 may be subject to inherent delays, particularly on the side of memory 158. Since the clock edges of the data strobe signals are used to validate data received from memory controller 12 when received by receiver 25 at memory 158, as well as to validate data transmitted from transmitter 26 of memory 158, it is important that setup and hold time requirements for both are observed. Moreover, the data strobe signals used herein are used to synchronize the sampling of multiple bits. Furthermore, the signal paths for conveying bits between memory controller 12 and memory 158 may each be subject to their own unique delays, and thus some inter-lane skew may be present among the data bits. It is desirable that each data signal be sampled at or near the center of a window that may be depicted by an eye diagram. Accordingly, procedures to calibrate the data strobe signals to compensate for inherent delays may be performed at certain times during operation of memory controller 12 in order to optimize the point in time at which the data strobe signals sample data.

The calibration procedures may be conducted under the control of calibration control unit 21, and involve performing a number of reads of from memory along with adjustments of an amount of delay applied to the data strobe signal being calibrated. The calibration of the data strobe delay may be performed periodically, and may sometimes be referred to as a horizontal calibration.

A reference voltage calibration may also be performed under the control of calibration control unit 21. The reference voltage may be that voltage that is used to distinguish between a logic 0 and a logic 1. Over time, due to process, voltage, and temperature variations, the reference voltage may need to be calibrated. This calibration may also be performed periodically, and may sometimes be referred to as a vertical calibration. Based on the calibration, calibration control unit 21 may set the reference voltage at reference voltage generator 35 using the signal RefVCtrl. The reference voltage, RefV, or an indication of the same, may be provided from reference voltage generator 35 to receiver 22.

In order to allow more efficient transition from one performance state to the next, calibration control unit 21 may perform calibrations of each of the different performance states. That is, prior to beginning normal operations, calibrations of each of the parameters that can be calibrated may be performed for each of the different performance states. Calibration of a data strobe signal may include varying its delay while conducting writes to memory and reads therefrom. The data read from the memory may be compared to the data that was written thereto. Mismatches between the written data and the data read from the memory indicate failures.

In one embodiment, a calibration may be conducted within a range of delays, beginning with a smallest delay of the range and continue up to the largest delay of the range. Alternatively, adjusting the delay from the largest to the smallest may be performed. In either case, the calibration may begin with the delay at one endpoint of the range, with writes to memory and corresponding reads therefrom being performed (with data comparisons thereafter). The delay may then be adjusted by increments, with the write/read/compare being performed at each increment, until the delay has reached the other endpoint of the range. From there, a passing range may be determined, along with parameters of the eye opening. This may be conducted on a bit-by-bit basis.

An initial calibration such as that described in the previous paragraph may be performed, for a given performance state, over a range of delay values referred to here as the full range. When re-entering that same performance state, a re-calibration may be performed over a smaller range of delay value referred to here as the restricted range. The restricted range, and endpoints thereof, may be based on worst-case variations of delay for that performance state and a given set of voltage and temperature conditions. The variation may be combined with a previously calibrated delay value in that performance state to determine the restricted range. For example, if the manufacturer's specifications state that, for current voltage and temperature conditions in a given performance state that the worst case variance is ±100 picosecond (ps), then the restricted range may have endpoints that are 100 ps less than the calibrated delay value to 100 ps more than the calibrated delay value. In some embodiments, extra variation in the form of phase correction may be included in calculating the endpoints of the restricted range. For example, the restricted range may be ±100 ps of the previously calibrated delay value along with an extra −90° at the lower endpoint and a extra +90° at the upper endpoint.

Generally speaking, the setting of the endpoints based on the worst case variation for the corresponding voltage and temperature conditions may result in a restricted range that is significantly smaller than the full range used in performing the initial calibration. This in turn can result in significant time savings when re-entering the particular performance state. In particular, restricting the range of delay values for which the re-calibration is conducted may allow the calibration to be conducted significantly faster than doing the same type of calibration over the full range.

Figure 3:
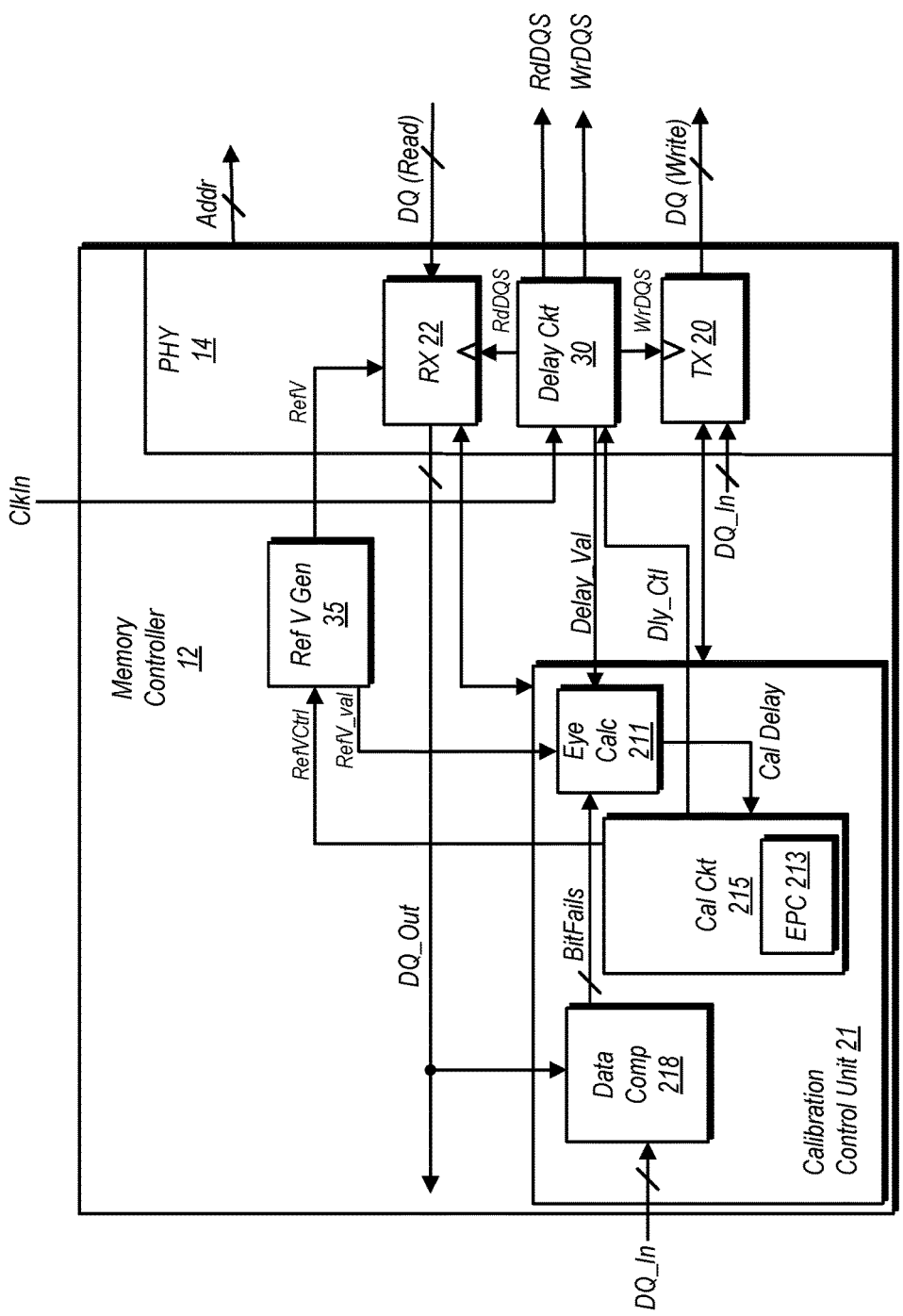
FIG. 3 is a block diagram illustrating one embodiment of a memory controller having a calibration control unit.

Turning now to FIG. 3, a block diagram illustrating one embodiment of a memory controller having a calibration control unit is illustrated. In the embodiment shown, calibration control unit 21 includes a calibration circuit 215, an endpoint calculation circuit (EPC) 213 within calibration circuit 215, an eye calculation circuit 211, and a data comparator unit 218. Calibration circuit 215 is configured to control the reference voltage value via the RefV_val signal provided to reference voltage generator 35. Similarly, calibration circuit 215 may also control the delay value applied to the data strobe signals via the Dly_Ctl signal provided to delay circuit 30. Memory controller 12 also includes a reference voltage generator 35 which is configured to generate the reference voltage used to distinguish a logic zero from a logic one on data read from the memory. The physical interface 14 of memory controller 12 includes a receiver 22, which is coupled to receive data from memory on reads therefrom, and a transmitter 20 configured to transmit data to memory on writes thereto. Also included in physical interface 14 is a delay circuit 30, which is used to provide and control delay applied to the read data strobe signal (RdDQS) and write data strobe signal (WrDQS) during reads and writes, respectively. Delay circuit 30 includes at least one delay locked loop (DLL) 301, and may also include additional DLL's and other circuitry for controlling the delays applied to the read and write data strobes. Calibrating the delay applied to the data strobe signal may include determining/calibrating a code provided to a DLL which is used in setting the delay.

It is noted that while both read data strobe and write data strobe signals have been disclosed, the discussion below focuses on a singular data strobe signal. This singular data strobe signal may be interpreted as the read data strobe or the write data strobe. Furthermore, the methodology discussed herein may apply to either of the data strobe signals disclosed herein, and the circuitry for performing the same may be re-configured to reflect such embodiments.

The various calibrations performed may include performing writes of data to memory and subsequently reading that data back from memory. The data that is read from memory may be compared to that which was written to memory to determine any discrepancies between the two. The comparisons may be performed by data comparator 218, which is coupled to receive data to be written to the memory via the DQ_In input and data read from memory via the DQ_Out input (the latter via receiver 22). For each cycle of data read from the memory, data comparator 218 may report any failing bits to eye calculation circuit 211. Eye calculation circuit in the embodiment shown is coupled to receive a delay value from delay circuit 30 and a reference voltage value from reference voltage generator 35 during each read of data from memory conducted during a calibration procedure. Based on the parameter settings used during the calibration and the record of failures, eye calculation circuit 211 may calculate eye diagrams for each bit read from memory. This may in turn provide information used in determining the calibrated parameter values (e.g., the delay applied to a data strobe) that determine the width of an eye opening, and thus factors such as optimal setup and hold times for sampling each bit upon its receipt from memory.

EPC 213 as noted above may calculate endpoints for performing restricted range calibrations. In one embodiment, EPC 213 may include storage that contains information for each of a number of different performance states and for various voltage/temperature operating conditions. The data may include indications of worst case variations for a given performance state and the current voltage and temperature operating conditions. The data may also include previously calibrated delay values for each of the various performance states. When changing to a performance state in which an initial calibration has previously been performed, EPC 213 may access the data to calculate endpoints for a restricted range calibration. These endpoints may then be used by calibration circuit 215 in determining a start and endpoint for performing the restricted range calibration.

Figure 4:
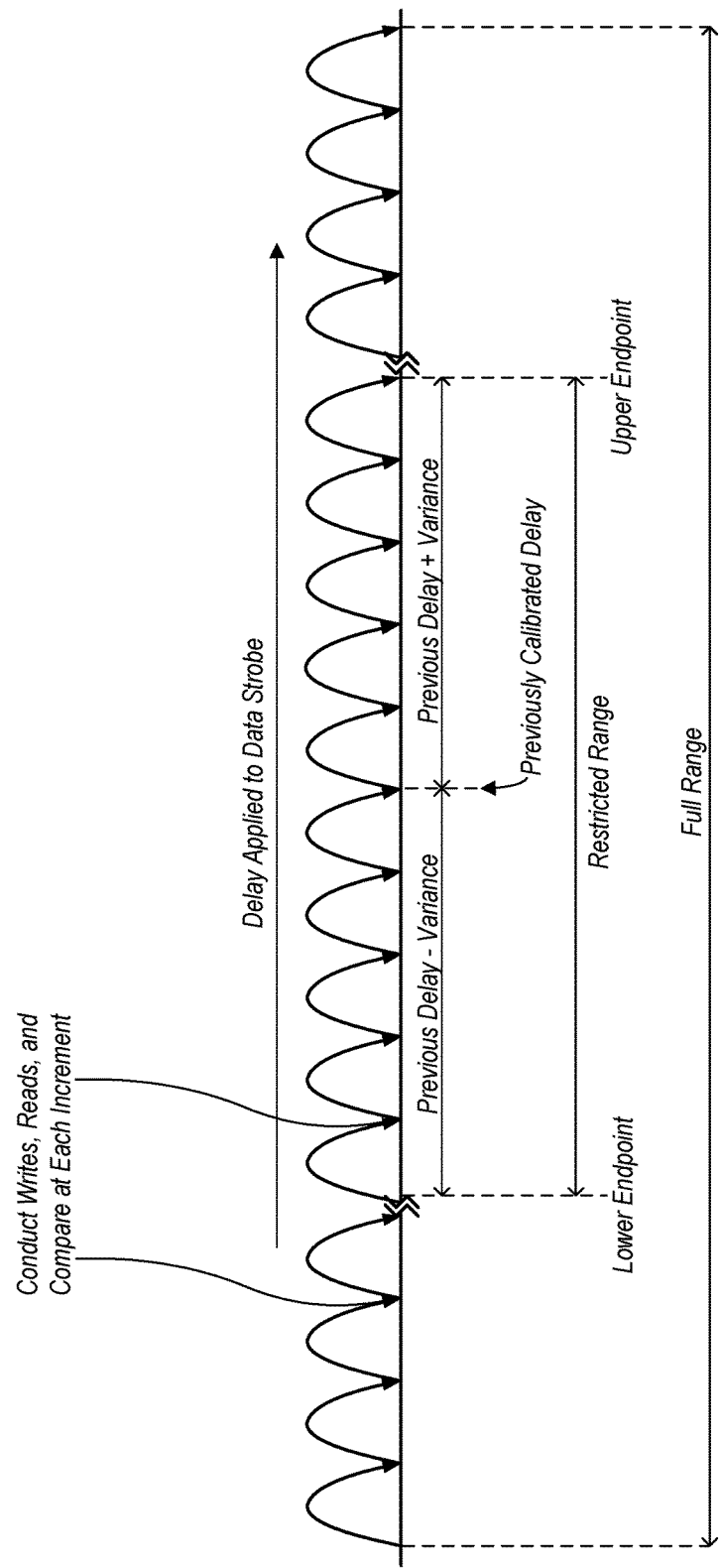
FIG. 4 is a graphic illustration of the full and restricted range calibrations conducted in one embodiment of a memory subsystem.

FIG. 4 is a graphic illustration of the full and restricted range calibrations conducted in one embodiment of a memory subsystem. In particular, FIG. 4 illustrates the difference between the full and restricted range calibrations, and further illustrates the endpoints of the restricted range.

For the full range calibration, a first write/read/compare cycle may be conducted at the lower endpoint of the full range, i.e. the point where the delay is the smallest. After completing the first write/read/compare cycle, the delay may be incremented, and the cycle performed again. The overall cycle of incrementing, followed by a write/read/compare cycle may be repeated a number of times until reaching the upper point of the range. Thereafter, the passing and failing results may be tallied. Passing results may be defined as those in which the data read matched that which was written. Failing results may be defined as those for which the data read did not match that which was written. It is also noted that the full scan may be performed for a number of different referenced voltages, and thus may be repeated. Performing the full scan for different reference voltages may allow for the calculation of an eye opening for each bit of data that is read, or selection of a reference voltage that yields the larges passing eye for all bits. In one embodiment, the final calibrated delay value may be one for which as many bits as possible are close to the center of their passing range, since it is possible that there may be some variation in eye openings for different bits. In another embodiment, the per-bit center points may be aligned using a per-bit deskew delay.

The restricted range scan may be performed over a significantly narrower range than the full range scan. As shown in FIG. 4, the restricted range may be calculated as a previously calibrated delay plus/minus a variance. The previously calibrated delay may be that which was determined during a full scan conducted in the same performance state. It is also possible and contemplated that a calibrated delay value from a previous restricted range scan may be used as a basis for determining the restricted range.

The variance may be determined in different ways. In one embodiment, the various may be based at least in part on manufacturer's specifications. Such information may specify a worst case variance for various conditions including the performance state (e.g., frequency of the input clock to the memory controller), current voltage and temperature conditions, and so forth. The calibration circuit may receive at least some of this information from an external source, e.g., from power management circuitry, or some type of metrology circuitry that tracks operating conditions within the system in which the apparatus discussed herein is implemented. Some information, such as the manufacturer's specifications noted above, may be stored in some type of memory implemented within the calibration circuitry/endpoint calculator.

The restricted range may be calculated by adding and subtracting the determined variance values. Subtracting the variance from the previously calibrated delay value may yield the lower endpoint of the restricted range, while adding the variance to the previously calibrated delay value may yield the upper endpoint of the restricted range.

Performance of the calibration using the restricted range may be conducted in largely the same manner as the full range calibration, with the range of delay values scanned being the primary difference. Thus, the restricted range scan may begin by performing a write/read cycle at one of the endpoints, followed by incrementing the delay and performing another write/read cycle. The write/read/increment cycle may be repeated until the delay has reached the other endpoint. It is noted that, while the scans discussed in conjunction with FIG. 4 progress from a lower endpoint to an upper endpoint, this is not a requirement. Accordingly, method and an apparatus embodiments in which the scan progresses from an upper endpoint to a lower endpoint are also possible and contemplated.

Figure 5:
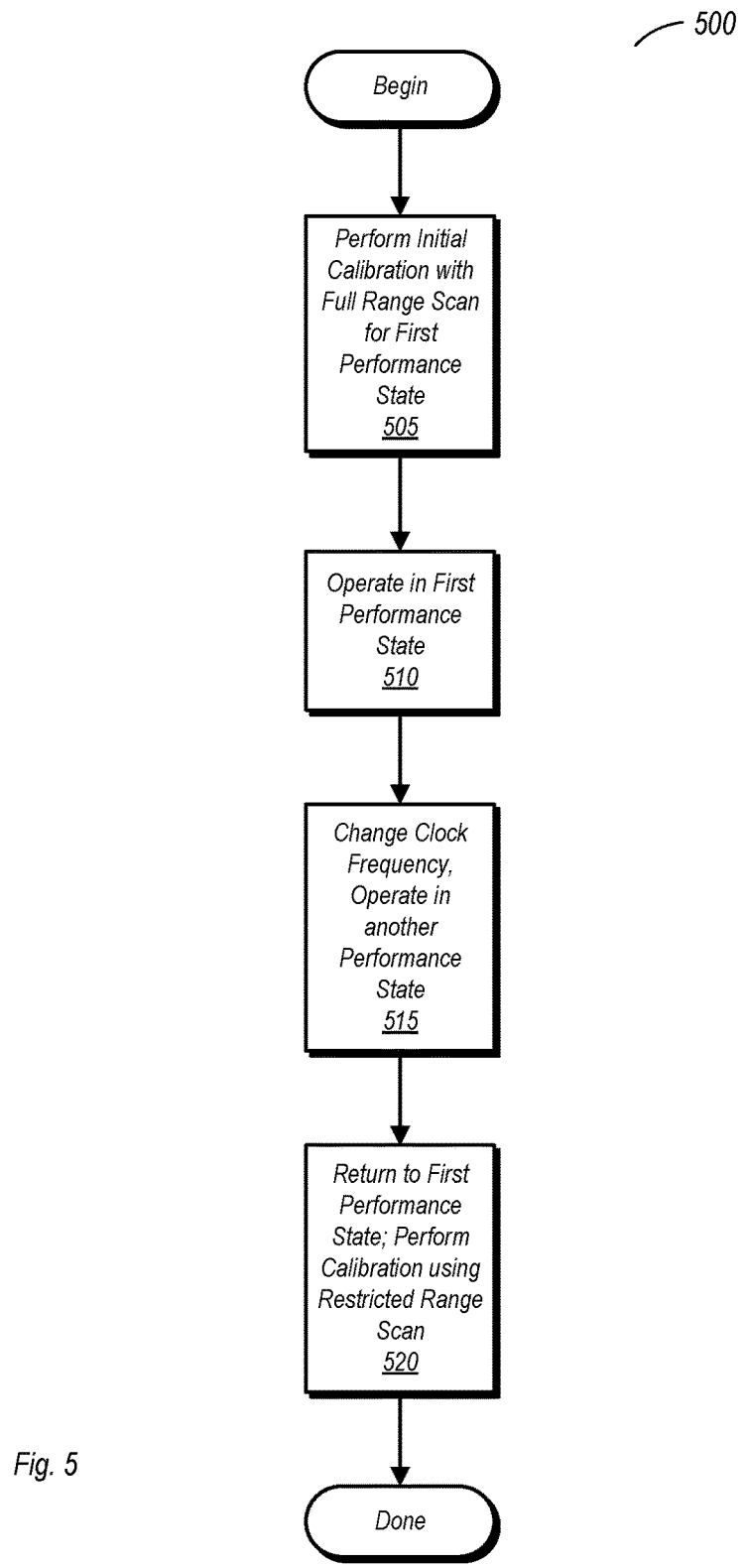
FIG. 5 is a flow diagram of one embodiment of a method for performing calibrations in a memory subsystem.

FIG. 5 is a flow diagram of one embodiment of a method for performing calibrations in a memory subsystem. Method 500 as discussed herein may be performed by various embodiments of the hardware discussed above. It is further contemplated that method 500 can be performed by other hardware embodiments not explicitly discussed herein. Method 500 may also be performed using any combination of hardware, firmware, and software, and thus any such embodiment capable of performing method 500 is considered to fall within the scope of this disclosure.

Method 500 begins with the performance of an initial calibration using a full range scan such as that discussed above with reference to FIG. 4 (block 505). The calibration may be performed in a given performance state, which may be a unique operating voltage/clock frequency combination. In some embodiments, initial calibrations may be performed for all possible performance states at the beginning of system operation (i.e. shortly after first being powered on). Occasionally, calibrations using the full range scan may be performed subsequent to the initial calibration, e.g., if necessitated by certain events or system operating conditions.

At some point after performing the initial calibration, the system may operate in the first performance state (block 510). Such operation may include setting the delay applied to the data strobe signal to the value determined by the initial calibration. Thereafter, a change in clock frequency may occur, and the system may begin operating in another performance state (block 515). A change of performance state may occur for various reasons. For example, an increase in needed memory bandwidth may necessitate operating in a performance state having a higher clock frequency and/or a higher operating voltage. Conversely, if operating in a performance state appropriate for a greater workload, a decrease in workload may make it desirable to operate in a performance state having a lower clock frequency and/or operating voltage. Generally speaking, a performance states may be chosen in an attempt to optimize the amount of performance obtained for the power expended.

Eventually, operation returns to the first performance state, wherein a calibration using the restricted range scan is performed (block 520). The restricted range scan may be performed over a range of delay values that is based on the delay value obtained during the initial calibration, as well as a variance value. The variance value may be determined at least in part using present voltage and temperature conditions and correlating these to predetermined variance values determined from manufacturer's specifications. For example, for a given set of voltage/temperature conditions, the manufacturer's specifications may indicate a worst case variance of +100 ps. This value may be combined with the previously calibrated delay value to determine the endpoints of the restricted range. In some cases, only the worst case variance is used in conjunction with the previously calibrated delay values. In other cases, it is possible that extra variance is added on, such as a time equivalent to a 90° phase shift. The resulting restricted range may nonetheless be significantly smaller than the full range over which the initial calibration is performed. This in turn may result in time savings that allow normal operation to begin in the first performance state sooner than would otherwise be possible if having to do the calibration over the full range.

It is noted that method 500 could be applied to any and all performance states in various embodiments of a system in which calibrations of a data strobe signal are conducted. Thus, the use of the term "first performance state" in the above discussion is not intended to imply that method 500 is performed for only one performance state or only for selected performance states in a system. Instead, method 500 may be used with any system having two or more performance states, and may be applied to any one of the performance states, selected ones, or all performance states.

Figure 6:
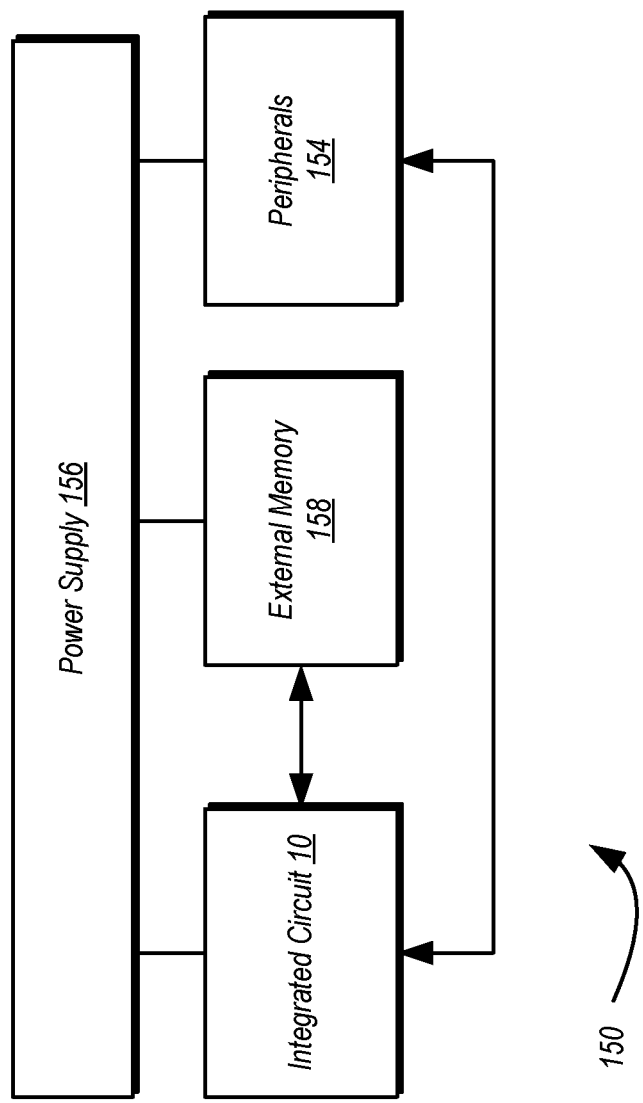
FIG. 6 is a block diagram of one embodiment of an exemplary system.

Turning next to FIG. 6, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc.

The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An apparatus comprising:
a memory subsystem including a memory and a memory controller coupled to the memory, wherein the memory controller is configured to convey a data strobe signal to the memory during transfers of data to and from the memory, wherein the memory controller is configured to operate in a first performance state according to a first clock frequency of a clock signal and in a second performance state according to a second clock frequency of the clock signal;
wherein the memory controller includes calibration circuitry configured to:
perform, in the first performance state, an initial calibration of a delay applied to the data strobe signal, wherein performing the initial calibration includes varying the delay over a first range of delay values;
perform, responsive to returning to the first performance state from the second performance state, a re-calibration, wherein performing the re-calibration comprises varying the delay over a second range of delay values that is less than the first range; and
set endpoints of the second range using a variance that is based at least in part on voltage and temperature in the memory subsystem.

2. The apparatus as recited in claim 1, wherein the calibration circuitry is configured to, during performance of the re-calibration, perform writes to memory and reads from memory while incrementing the delay between a first endpoint of the second range and a second endpoint of the second range.

3. The apparatus as recited in claim 1, wherein calibration circuitry includes endpoint computation circuitry configured to calculate the endpoints of the second range.

4. The apparatus as recited in claim 3, wherein the endpoint computation circuitry is configured to determine a first endpoint of the second range by subtracting the variance from a previously calibrated delay value, and further configured to determine a second endpoint of the second range by adding the variance to the previously calibrated delay value.

5. The apparatus as recited in claim 1, wherein the calibration circuitry further comprises a data comparison circuit configured to, during performance of calibration procedures including the initial calibration and the re-calibration, compare data read from the memory to expected data.

6. The apparatus as recited in claim 1, wherein the calibration circuitry is configured to, during performance of the initial calibration, perform writes to and reads from memory while incrementing the delay between a first endpoint and a second endpoint of the first range.

7. The apparatus as recited in claim 1, further comprising a power management circuit, wherein the power management circuit is configured to change a frequency of the clock signal when changing between the first performance state and the second performance state, and further configured to provide an indication to the memory control of a pending change of performance state.

8. A method comprising:
performing, in a memory subsystem having a memory and a memory controller, a first calibration of a delay applied to a data strobe conveyed from the memory controller to the memory when the memory subsystem is operating according to a first clock frequency, wherein during operation the memory subsystem is configured to operate in a first performance state according to the first clock frequency and in a second performance state according to a second clock frequency, and wherein performing the first calibration includes varying data strobe delay values within a first range;
changing, during operation of the memory subsystem, from the second performance state to the first performance state; and
performing, subsequent to the first calibration, a second calibration of the delay responsive to entering the first performance state, wherein performing the second calibration includes varying data strobe delay values within a second range that is less than the first range.

9. The method as recited in claim 8, further comprising determining first and second endpoints of the second range using a variance that is based at least in part on corresponding voltage and temperature values.

10. The method as recited in claim 9, further comprising:
calculating the first endpoint of the second range by subtracting the variance from a previously calibrated delay value; and
calculating the second endpoint of the second range by adding the variance to the previously calibrated delay value.

11. The method as recited in claim 9, wherein performing the second calibration comprises writing data to memory and reading data from memory while incrementing the delay between the first endpoint and the second endpoint.

12. The method as recited in claim 8, wherein performing calibration procedures including the first calibration and the second calibration comprises comparing data read from memory to expected data.

13. The method as recited in claim 8, wherein performing the first calibration comprises writing data to memory and reading data from memory while incrementing the delay between endpoints of the first range.

14. A system comprising:
a memory;
a memory controller coupled to the memory, wherein the memory controller is configured to convey a data strobe signal to the memory during transfers of data between the memory controller and the memory, and wherein the memory controller is configured to operate in a first performance state according to a first frequency of a clock signal received by the memory controller, and further configured to operate in a second performance state according to a second frequency of the clock signal;
wherein the memory controller includes a calibration circuit configured to:
perform, while in the first performance state, a first calibration of a delay applied to the data strobe signal, wherein the delay is varied over a first range of values during performance of the first calibration; and perform, responsive to re-entry into the first performance state, a second calibration of the delay applied to the data strobe signal, wherein the delay is varied over a second range of values during performance of the second calibration, the second range being less than the first range.

15. The system as recited in claim 14, wherein the calibration circuit includes an endpoint calculation circuit configured to calculate endpoints second range.

16. The system as recited in claim 15, wherein the endpoint calculation circuit is configured to calculate a first endpoint of the second range by subtracting a variance from a previously calibrated delay, and further configured to calculate the second endpoint of the second range by adding the variance to the previously calibrated delay.

17. The system as recited in claim 16, wherein the calibration circuit is configured to, during performance of the second calibration, write data to and read data from memory while incrementing the delay between the first and second endpoints of the second range.

18. The system as recited in claim 16, wherein the variance is based at least upon corresponding voltage and temperature values.

19. The system as recited in claim 14, wherein the memory controller includes a data comparison circuit configured to, during performance of the first and second calibrations, compare data read from the memory to expected data.

* * * * *